United States Patent
D'Abreu

(10) Patent No.: US 9,159,426 B1
(45) Date of Patent: Oct. 13, 2015

(54) THREE DIMENSIONAL MEMORY DEVICE HAVING STACKED CONDUCTIVE CHANNELS

(71) Applicant: SANDISK TECHNOLOGIES INC., Plano, TX (US)

(72) Inventor: Manuel Antonio D'Abreu, El Dorado Hills, CA (US)

(73) Assignee: SANDISK TECHNOLOGIES INC., Plano, TX (US)

(*) Notice: Subject to any disclaimer, the term of this patent is extended or adjusted under 35 U.S.C. 154(b) by 0 days.

(21) Appl. No.: 14/272,363

(22) Filed: May 7, 2014

(51) Int. Cl.
*H01L 27/115* (2006.01)
*G11C 16/04* (2006.01)
*H01L 21/02* (2006.01)
*H01L 21/768* (2006.01)

(52) U.S. Cl.
CPC ...... *G11C 16/0483* (2013.01); *H01L 21/02587* (2013.01); *H01L 21/768* (2013.01); *H01L 27/11551* (2013.01); *H01L 27/11578* (2013.01)

(58) Field of Classification Search
CPC .............. H01L 25/0657; H01L 27/11551; H01L 27/11578
USPC ............ 257/314–316, 324, 326, E29.3, 257/E29.309, E27.103
See application file for complete search history.

(56) References Cited

U.S. PATENT DOCUMENTS

| | | | |
|---|---|---|---|
| 7,514,321 B2* | 4/2009 | Mokhlesi et al. | 438/259 |
| 7,884,417 B2* | 2/2011 | Mizukami et al. | 257/324 |
| 2009/0097309 A1 | 4/2009 | Mizukami et al. | |
| 2010/0109072 A1 | 5/2010 | Kidoh et al. | |
| 2010/0232224 A1 | 9/2010 | Maeda et al. | |
| 2011/0065270 A1* | 3/2011 | Shim et al. | 438/589 |
| 2011/0151667 A1 | 6/2011 | Hwang et al. | |
| 2012/0061744 A1* | 3/2012 | Hwang et al. | 257/324 |
| 2012/0170369 A1* | 7/2012 | Kim et al. | 365/185.05 |

OTHER PUBLICATIONS

Jang, Jaehoon et al. "Vertical Cell Array Using TCAT (Terabit Cell Array Transistor) Technology for Ultra High Density NAND Flash Memory," IEEE, 2009 Symposium on VLSI Technology Digest of Technical Papers, Honolulu, HI, Jun. 16-18, 2009, pp. 192-193.
Nowak, Etienne et al. "Intrinsic Fluctuations in Vertical NAND Flash Memories," IEEE, 2012 Symposium on VLSI Technology Digest of Technical Papers, Honolulu, HI, Jun. 12-14, 2012, pp. 21-22.
Arya, Pranav "A Survey of 3D NAND Flash Memory," http://lpsoc.eic.nctu.edu.tw/courses/MS2012Autumn/term/Report/3D%20Nand%20Flash%20Memory%20-%20PranavArya(0160814).pdf, Mar. 19, 2013, 11 pages.
Walker, Andrew J. "A Rigorous 3-D NAND Flash Cost Analysis," IEEE Transactions on Semiconductor Manufacturing, vol. 26, No. 4, Nov. 2013, pp. 619-625.
International Search Report and Written Opinion of the International Searching Authority (EPO) for International Application No. PCT/US2015/024940, mailed Jul. 1, 2015, 9 pages.

* cited by examiner

*Primary Examiner* — Allison P Bernstein
(74) *Attorney, Agent, or Firm* — Toler Law Group, PC

(57) ABSTRACT

A method includes forming a first group of memory cells coupled to a first conductive channel. The first conductive channel is substantially perpendicular relative to a surface of a substrate. The method further includes forming a second group of memory cells coupled to a second conductive channel. The second conductive channel is electrically coupled to the first conductive channel and is substantially perpendicular relative to the surface of the substrate.

20 Claims, 8 Drawing Sheets

THREE DIMENSIONAL MEMORY DEVICE HAVING STACKED CONDUCTIVE CHANNELS

FIELD OF THE DISCLOSURE

The present disclosure is generally related to a three dimensional memory device having vertical conductive channels.

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the non-volatile storage devices to store and provide rapid access to a large amount of data. Additionally, non-volatile data storage devices may be configured to be coupled to another device, such as a host device, or may be used as storage components, such as solid state drives (SSDs), accessible to multiple servers at a data center.

Advances in memory device technology have resulted in memory devices that have a three dimensional (3D) configuration. A 3D memory device may include memory cells that are vertically stacked and positioned in different layers (e.g., different levels) of multiple vertically stacked layers. A group of memory cells that is vertically stacked may be coupled to a conductive channel. During manufacturing of the 3D memory device, a hole may be created through the multiple vertically stacked layers to enable formation of the conductive channel. However, as a number of layers that the hole extends through increases, controlling formation of the hole becomes difficult. For example, a shape of the hole may not be a cylindrical shape through all of the multiple layers; rather, the hole may have a tapered shape through one or more of the multiple layers. To illustrate, a cross-section of the hole through the multiple layers may have a conical shape or a funnel shape. When the hole does not have a consistent shape (e.g., a consistent diameter) through all of the multiple layers, physical dimensions of one or more memory cells may be affected which may result in reduced performance or failure of the one or more memory cells. Further, a channel formed in the hole that does not have a consistent shape may lead to variations in charge retention of memory cells coupled to the channel and may prohibit the memory cells from storing multiple bits per cell. Additionally, if the hole is formed through too many layers, the hole can become unstable and may collapse. Accordingly, a number of memory cells that may be vertically stacked, and thus a size and/or a storage density of the 3D memory device, may be limited based on the number of layers through which the hole may be formed.

SUMMARY

Techniques are disclosed for forming a memory device having a three-dimensional (3D) configuration that includes multiple conductive channels. The multiple conductive channels may have a stacked configuration and may be electrically coupled together. For example, the memory device may be produced by forming a first conductive channel in a first group of physical layers. The first conductive channel may be substantially perpendicular to a surface of a substrate and may be coupled to a first group of storage elements. After the first conductive channel is formed, a second conductive channel may be formed in a second group of physical layers that are formed over the first group of physical layers. The second conductive channel may be substantially perpendicular to the surface of the substrate and may be coupled to a second group of storage elements. The first conductive channel may be electrically coupled to the second conductive channel via a landing (e.g., a connector). For example, the landing may extend through an etch stop layer that is between the first group of physical layers and the second group of physical layers.

By stacking multiple conductive channels in a memory device, a number of physical layers (and a number of storage elements) that may be stacked may exceed an etch depth limitation. Accordingly, the memory device that stacks multiple conducive channels may include more storage elements per vertical stack and may have a higher yield of storage elements as compared to a memory storage device that includes a number of storage elements per vertical stack that is limited based on the etch depth limitation.

DETAILED DESCRIPTION

Particular embodiments of the present disclosure are described with reference to the drawings. In the description, common features are designated by common reference numbers throughout the drawings.

Figure 1:
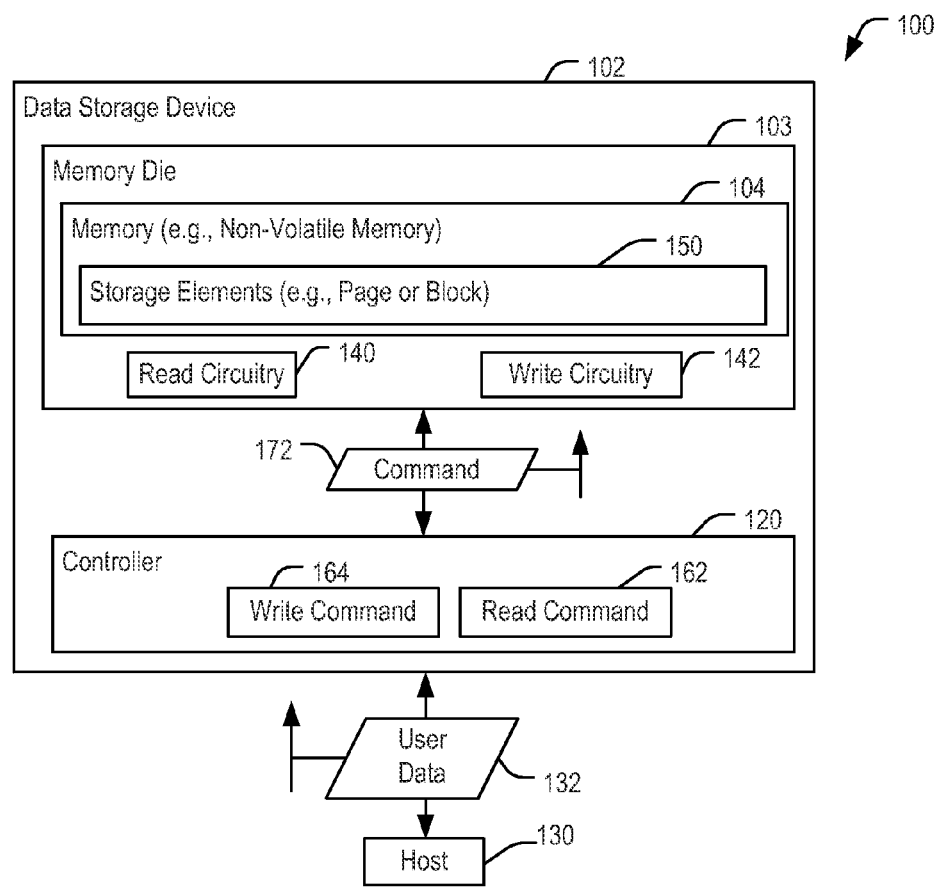
FIG. 1 is a block diagram of a particular illustrative embodiment of a system including a data storage device that includes a memory device having stacked conductive channels.
Figure 1:
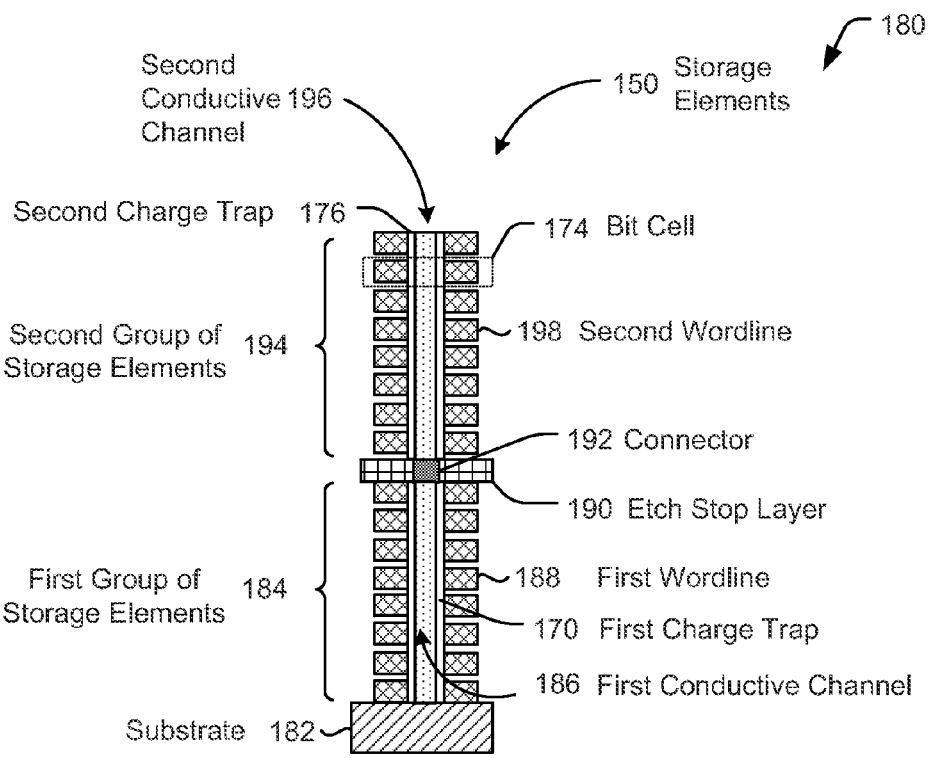

FIG. 1 is a block diagram of a particular illustrative embodiment of a system 100 including a data storage device 102 coupled to an accessing device, such as a host device 130. The data storage device 102 may be coupled to the host device 130 via a communication path, such as a wired communication path and/or a wireless communication path. The data storage device 102 may be embedded within the host device 130, such as in accordance with an embedded MultiMedia Card (eMMC®) (trademark of Joint Electron Devices Engineering Council (JEDEC) Solid State Technology Association, Arlington, Va.) configuration. Alternatively, the data storage device 102 may be removable from (i.e., "removably" coupled to) the host device 130. For example, the data storage device 102 may be removably coupled to the host device 130 in accordance with a removable universal serial bus (USB) configuration.

The host device 130 may include a processor and a memory. The memory may be configured to store data and/or instructions that may be executable by the processor. The memory may be a single memory or may include one or more memories, such as one or more non-volatile memories, one or more volatile memories, or a combination thereof. The host device 130 may issue one or more commands to the data storage device 102, such as one or more requests to read data from or write data to a memory 104 of the data storage device 102. For example, the host device 130 may send data, such as user data 132 to be written to the memory 104 of the data storage device 102.

The data storage device 102 includes a controller 120 coupled to the memory 104, such as a non-volatile memory. The controller 120 may be coupled to the memory 104 via a bus, an interface, another structure, or a combination thereof. The memory 104 has a three dimensional (3D) memory configuration, as described further herein. The memory 104 may store data, such as the user data 132.

The memory 104 may be included on a memory die 103 that is separate from the controller 120 and coupled to the controller 120 (e.g., via a bus). However, in other implementations, the memory 104 and the controller 120 may be included on a common die. The memory 104 may include multiple blocks each having multiple pages of storage elements. The example of FIG. 1 depicts that the memory 104 includes a plurality of storage elements 150, which may correspond to a block or a page (e.g., a wordline) of the memory 104, as illustrative, non-limiting examples. Each storage element (e.g., memory cell or bit cell) of the storage elements 150 may be configured to store a data value (e.g., a bit value), such as "1" and "0."

The memory die 103 may further include read circuitry 140 and write circuitry 142 that are configured to enable operations of reading data from the storage elements 150 of the memory 104 and writing data to the storage elements 150 of the memory 104, respectively. Although illustrated as separate components, the read circuitry 140 and the write circuitry 142 may be included in a single component of the memory die 103.

An illustrative example of the storage elements 150 is illustrated and generally designated 180. The example 180 depicts a cross-sectional elevation view of a vertical conducive channel structure extending through holes formed in a stack of wordlines to form a vertical column of storage elements. An example of a perspective view of a three-dimensional (3D) memory is described with reference to FIG. 7. The storage elements 150 may be formed on a substrate 182, such as a silicon (Si) substrate. Each storage element (e.g., a memory cell) of the storage elements 150 may include a bit cell, such as a representative bit cell 174. The bit cell 174 may include (or be coupled to) a wordline, a portion of a charge trap, and a portion of a conductive channel.

The plurality of storage elements 150 may include a first group of storage elements 184 and a second group of storage elements 194. The first group of storage elements 184 may be between the substrate 182 and the second group of storage elements 184. The first group of storage elements 184 may be formed in a first group of physical layers and may correspond to a first set of wordlines including a representative first wordline 188. The first group of storage elements 184 may be coupled to a first conductive channel 186. A first charge trap layer 170 may be positioned between the first set of wordlines and the first conductive channel 186 (e.g., forming a sheath around the first conductive channel 186). Although the first group of storage elements 184 is illustrated as being on the substrate 182, another group of storage elements may be between the substrate 182 and the first group of storage elements 184 (e.g., another group of physical layers may be between the substrate 182 and the first group of physical layers).

The second group of storage elements 194 may be formed in a second group of physical layers and may correspond to a second set of wordlines including a representative second wordline 198. The second group of storage elements 194 may be coupled to a second conductive channel 196. A second charge trap layer 176 may be positioned between the second set of wordlines and the second conductive channel 196.

Figure 2:
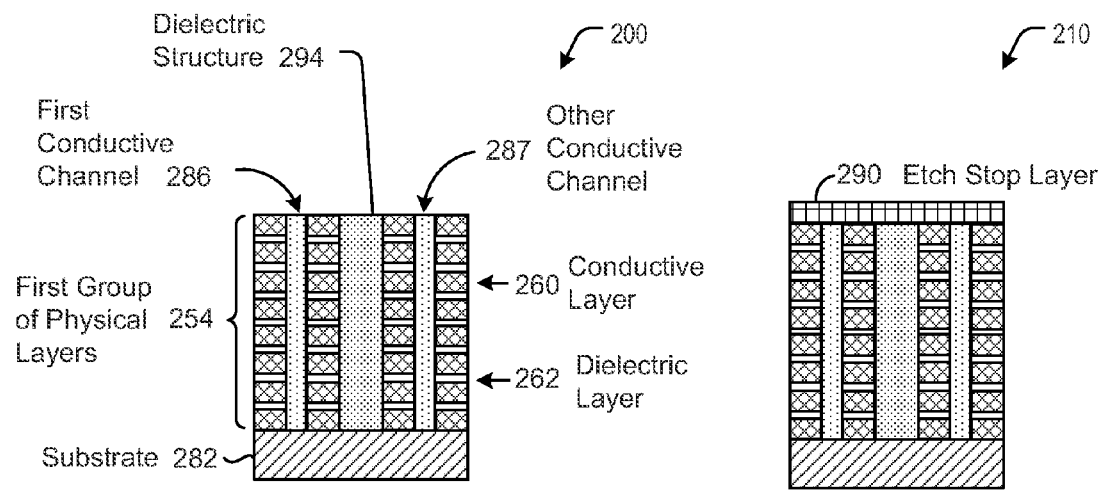
FIG. 2 illustrates a process of fabricating a memory device including stacked conductive channels.
Figure 2:
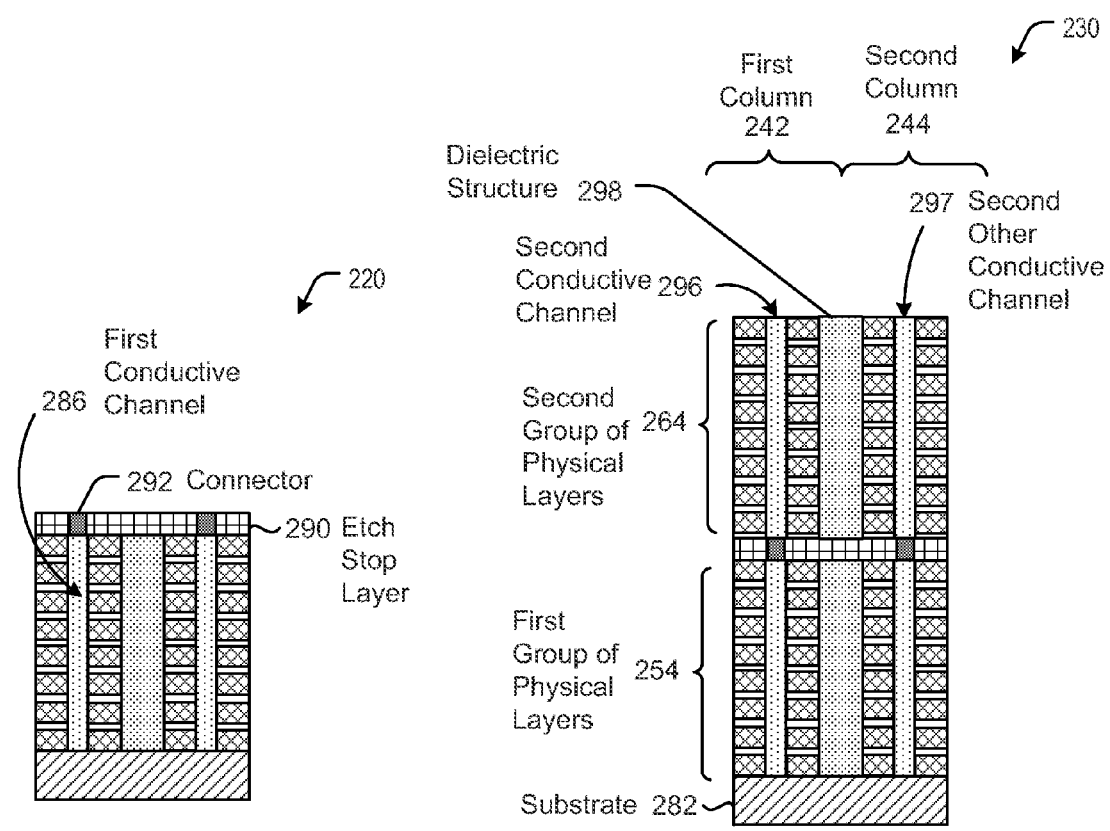

The first conductive channel 186 may be formed in a corresponding first hole in the first group of physical layers and the second conductive channel 196 may be formed in a corresponding second hole in the second group of physical layers, as described further with reference to FIG. 2. For example, the first hole may be formed during a first etch operation performed on the first group of physical layers and the second hole may be formed during a second etch operation performed on the second group of physical layers. A first number of physical layers of the first group of physical layers and/or a second number of physical layers of the second group of physical layers may be less than or equal to an upper limit of the number of layers of a group of multiple layers (e.g., physical layers) that may be etched to form a hole (e.g., a cavity) having a substantially cylindrical shape (e.g., generally cylindrical in shape within manufacturing and/or fabricating tolerances and errors), a substantially consistent cross-sectional diameter (e.g., generally consistent cross-sectional diameter within manufacturing and/or fabricating tolerances and errors), and/or a substantially consistent cross-sectional circumference (e.g., generally consistent cross-sectional circumference within manufacturing and/or fabricating tolerances and errors) through the group of multiple layers. When the first conductive channel 186 and the second conductive channel 196 are coupled in a stacked configuration, a total number of physical layers (e.g., based on a sum of the first number of physical layers and the second number of physical layers) in which the first conductive channel 186 and the second conductive channel 196 are included may be greater than the upper limit of the number of layers of the group of multiple layers that may be etched to form a single hole having a substantially cylindrical shape and/or a substantially consistent diameter through the group of multiple layers. Accordingly, a memory device having stacked conducive channels, such as the first conductive channel 186 and the second conductive channel 196, may include more storage elements per vertical stack and may have a higher density of storage elements as compared to a memory storage device that includes a number of storage elements per vertical stack that is limited based on the etch depth limitation.

Each of the first conductive channel 186 and the second conductive channel 196 may be substantially perpendicular (e.g., generally perpendicular within manufacturing and/or fabricating tolerances and errors) relative to a surface of the substrate 182. For example, a first axis of the first conductive channel 186 may be substantially perpendicular relative to the surface of the substrate 182, and a second axis of the second conductive channel 196 may be substantially perpendicular relative to the surface of the substrate 182. The first axis and the second axis may be aligned (or substantially aligned), such that the first axis and the second axis are the same axis, or the first axis and the second axis may be offset, such that the first axis is substantially parallel to the second axis.

An etch stop layer 190 may be between the first group of storage elements 184 and the second group of storage elements 194. The first conductive channel 186 may be coupled (e.g., electrically coupled) to the second conductive channel 196 via a connector 192 (e.g., a landing) that extends through the etch stop layer 190.

The first conductive channel 186 and the second conductive channel 196 may be coupled in a stacked configuration to form a portion of a column. The column (e.g., the first conductive channel 186 and the second conductive channel 196) may be coupled to a bit line and to a source line. For example, the second conductive channel 196 may be coupled to a bit line and the first conductive channel 186 may be electrically coupled to the bit line through the second conductive channel 196. As another example, the first conductive channel 186 may be coupled to a source line and the second conductive channel 196 may be electrically coupled to the source line through the first conductive channel. Although the storage elements 150 are illustrated as including two conductive channels (e.g., the first conductive channel 186 and the second conductive channel 196) in a stacked configuration to form the portion of the column, more than two conductive channels may be included in the stacked configuration.

The controller 120 may receive data and commands (e.g., instructions) from the host device 130 and may send data (and commands) to the host device 130. The controller 120 may send data and commands, such as a command 172, to the memory 104 and may receive data from the memory 104. For example, the command 172 sent by the controller 120 to the memory 104 may include one or more write commands, such as a write command 164, to store the data, such as the user data 132, to a specified address of the memory 104. The write command 164 may specify a physical address of a portion of the memory 104 (e.g., a physical address of a wordline of the memory 104) that is to store the data. The controller 120 is configured to send one or more read commands, such as a read command 162, to the memory 104 to access data from a specified address of the memory 104. As an example, the command 172 sent by the controller 120 to the memory 104 may include the read command 162 to access a representation of the user data 132 stored in the memory 104. The read command 162 may specify the physical address of a portion of the memory 104 (e.g., a physical address of a wordline storing the user data 132).

The controller 120 may include an error correction code (ECC) engine (not shown). The ECC engine may be configured to receive data, such as the user data 132, and to generate one or more error correction code (ECC) codewords (e.g., including a data portion and a parity portion) based on the data. For example, the ECC engine may include an encoder configured to encode the data using an ECC encoding technique. The ECC engine may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The ECC engine may include a decoder configured to decode data read from the memory 104 to detect and correct bit errors that may be present in the data. For example, the ECC engine may correct a number of bit errors up to an error correction capability of an ECC technique used by the ECC engine. A number of errors identified by the ECC engine may be tracked by the controller 120, such as by the ECC engine. For example, based on the number of errors, the ECC engine may determine a bit error rate (BER) associated with one or more blocks of the memory 104.

During operation of the data storage device 102, the controller 120 may receive the user data 132 from the host device 130 to be written to the memory 104. The controller 120 may send the command 172 that includes the write command 164 to the memory die 103. The write command 164 may command the memory 104 to write the user data 132 (or an encoded version of the user data 132) into a particular location in the memory 104, such as a location that may correspond to one or more of the storage elements 150. Based on the write command 164, the write circuitry 142 may write the user data 132 (or an encoded version of the user data 132) to the memory 104. For example, the user data 132 (or an encoded version of the user data 132) may be stored in one or more storage elements, such as storage elements included in the first group of storage elements 184 and/or included in the second group of storage element 194. For example, one or more data bits may be stored in the bit cell 174 by applying a voltage difference to the second conductive channel 196 and a wordline to cause charge tunneling into the second charge trap 176 within the bit cell 174. Injection of charge into the second charge trap 176 alters a threshold voltage of the bit cell 174 to a range that indicates the one or more data bits. The bit cell 174 may include an active area that is associated with an area of the bit cell 174 that is conductively throttled by a charge trap portion of the bit cell 174. For example, the active area of the bit cell 174 may include a portion (e.g., the charge trap portion) of the second charge trap 176 and a portion of the second conductive channel 196 proximate (e.g., adjacent) to the portion of the second charge trap 176.

After the user data is written to the memory 104, the controller 120 may receive a read command from the host device 130. The controller 120 may send another command 172 that includes the read command 162. Based on the read command 162, the read circuitry 140 may read a representation of the user data 132 from the memory 104. For example, the read circuitry 140 may apply a high voltage to non-selected wordlines of the stack, apply a read voltage to a selected wordline, and determine, based on a current through the second conductive channel 196, whether the voltage trap of the bit cell 174 is greater than or less than the read voltage. The user data 132 read from the memory 104 may be provided to the controller 120 to be sent to the host device 130.

By stacking multiple conductive channels in a memory device, a number of physical layers (and a number of storage elements) that may be stacked is not limited by a number of layers through which a hole for a particular conductive channel may be formed. Accordingly, the memory device that stacks multiple conducive channels may include more storage elements per vertical stack and may have a higher yield of storage elements as compared to a memory storage device have a number of storage elements per vertical stack that is limited based on a number of layers through which a hole of a conductive channel may be formed.

Referring to FIG. 2, an illustrative diagram of stages of a process of fabricating a memory device having stacked conductive channels is depicted. For example, the memory device may include or correspond to the memory 104 of FIG. 1.

A first illustrative diagram of at least one stage of a process of fabricating a memory device after forming and planarizing a first group of storage elements is depicted and generally designated 200. For example, the first group of storage elements may include or correspond to the first group of storage elements 184 of FIG. 1. The first group of storage elements may include a first set of storage elements coupled to a first conductive channel 286 and may include a second set of storage elements coupled to another conductive channel 287 adjacent to the first conductive channel 286. The first set of storage elements of the first group of storage elements and the second set of storage elements of the second group of storage elements may be separated by a dielectric structure 294, such as an oxide material to provide structural rigidity and that electrically insulates the first group of storage elements from the second group of storage elements. The first conductive channel 286 may include a conductive material, such as a metal (e.g., copper, gold, silver, or aluminum, as illustrative, non-limiting embodiments). The first conductive channel 286 may include or correspond to the first conductive channel 186 of FIG. 1.

The first group of storage elements may be formed in a first group of physical layers 254. The first group of physical layers 254 may include alternating conductive and dielectric layers, such as a representative conductive layer 260 and a representative dielectric layer 262. A single physical layer may include a single conductive layer or may include a conductive layer and a dielectric layer. Each conductive layer of the first group of physical layers 254 may include or correspond to a wordline, such as the first wordline 188 of FIG. 1. It is noted that a charge trap layer of the storage elements, such as the first charge trap layer 170 and/or the second charge trap layer 176 of FIG. 1, is not illustrated for clarity of illustration.

A second illustrative diagram of at least one stage of the process of fabricating the memory device after forming an etch stop layer is depicted and generally designated 210. An etch stop layer 290 may be formed above (or on) the upper surface (i.e., the surface furthest from the substrate 282) of the first group of physical layers 254 that contains the first group of storage elements. For example, the etch stop layer 290 may include or correspond to the etch stop layer 190 of FIG. 1. The first group of physical layers 254 may be between the etch stop layer 290 and the substrate 282.

A third illustrative diagram of at least one stage of the process of fabricating the memory device after forming one or more connectors is depicted and generally designated 220. Connectors, such as a representative connector 292, may be formed through the etch stop layer 290. For example, the connector 292 may be formed by etching an opening through the etch stop layer 290 to expose the upper surface of the first conductive channel 286. A conductive material (e.g., copper) or an insulator may be deposited in the opening and may be coupled to the first conductive channel 286. The connector 292 (e.g., a landing) may include or correspond to the connector 192 of FIG. 1. Although the connector 292 is illustrated as being formed after formation of the etch stop layer 290, in other embodiments, the connector 292 may be formed prior to the etch stop layer 290 being formed. For example, the connector 292 may be formed to be in contact with the first conductive channel 186. After formation of the connector, the etch stop layer 290 may be formed above the connector 292 and a portion of the etch stop layer may be removed (e.g., planarized) to expose a portion of the connector 292.

A fourth illustrative diagram of at least one stage of the process of fabricating the memory device after forming a second group of storage elements is depicted and generally designated 230. For example, the second group of storage elements may include or correspond to the second group of storage elements 194 of FIG. 1. The second group of storage elements may include a first set of storage elements coupled to a second conductive channel 296 and may include a second set of storage elements coupled to another conductive channel 297 adjacent to the second conductive channel 296. The first set and the second set of storage elements may be separated from each other by a dielectric structure 298. For example, an etch process (e.g., one or more etch operations) may be performed to remove a portion of the second group of physical layers 264 (and to form a cavity) between the second conductive channel 296 and the second other conducive channel 297. The etch stop layer 290 may protect the first group of physical layers 254 and/or the first dielectric structure 294 from being damaged by the etch process performed on the portion of the second group of physical layers 264. The etch process performed on the second group of physical layers 264 may form a trench into which the second dielectric structure 298 is formed. Creating the trench and depositing the second dielectric structure 298 between the second conductive channel 296 and the conducive channel 297 may form wordlines (associated with the second group of physical layers 264) for each of the first column 242 and the second column 244.

The second conductive channel 296 may include a conductive material, such as a metal (e.g., copper, gold, silver, or aluminum, as illustrative, non-limiting embodiments). The second conductive channel 296 may include or correspond to the second conductive channel 196 of FIG. 1. The second conductive channel 296 may be coupled (e.g., electrically coupled) to the first conductive channel 286 via the connector 292.

The second group of storage elements is formed in a second group of physical layers 264. The second group of physical layers 264 may include alternating conductive and dielectric layers. Each conductive layer of the second group of physical layers 264 may include or correspond to a wordline, such as the representative second wordline 198 of FIG. 1.

As illustrated in the diagram 230, the storage elements are stacked in two columns, such as a first column 242 and a second column 244. The first column 242 and the second column 244 may be separated at least by one or more dielectric structures, such as the first dielectric structure 294 and the second dielectric structure 298. Although the memory device illustrated in the diagram 230 includes two columns (e.g., the first column 242 and the second column 244), the memory device may include more than two columns. Each of a first number of layers of the first group of physical layers 254 and a second number of layers of the second group of physical layers 264 may be less than an etch depth limitation. As illustrated in the diagram 230, the first group of physical layers 254 and the second group of physical layers 264 each include eight physical layers. However, in other embodiments, the first group of physical layers 254 and/or the second group of physical layers 264 may include less than or more than eight physical layers. Additionally, in other embodiments, the first group of physical layers 254 and the second group of physical layers 264 may each include a different number of physical layers Further, in other embodiments, the first column 242 and/or the second column 244 may include more than two groups of physical layers, as described further with reference to FIGS. 3 and 4.

In a particular embodiment, the first column 242 may be coupled to a first bit line and to a first source line. The second column 244 may be coupled to a second bit line and to a second source line. The first bit line may be distinct from the second bit line, and the first source line may be distinct from the second source line.

In another particular embodiment, the first column 242 and the second column 244 may be electrically coupled by a connector (not shown) that is included in the substrate. For example, when the first column 242 and the second column 244 are electrically coupled, the first column 242 and the second column 244 may form a "U" shape channel that can be coupled at one end to a bit line and at the other end to a source line.

The memory device may include the etch stop layer 290 and one or more connectors, such as the connector 292, between the first group of physical layers 254 (e.g., the first group of storage elements) and the second group of physical layers 264. The etch stop layer 290 and/or the one or more connectors enables formation of a particular conductive channel (e.g., the second conductive channel 296) stacked on another conductive channel (e.g., the first conductive channel 286) while preserving an integrity of lower physical layers and providing electrical continuity between different conductive channels.

Figure 3:
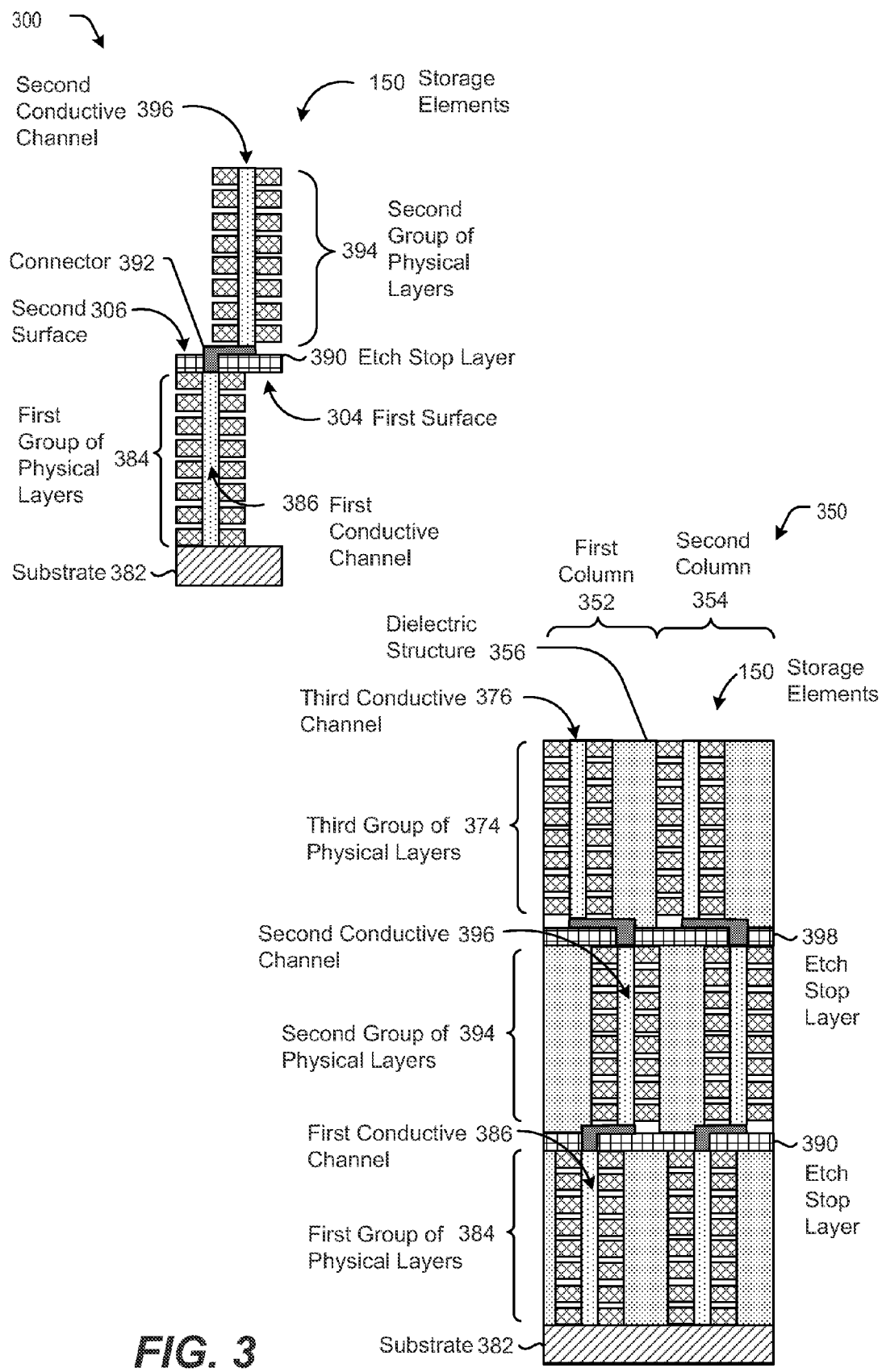
FIG. 3 illustrates embodiments of the memory device of FIG. 1.

Referring to FIG. 3, embodiments of the memory 104 of FIG. 1 are depicted. A first embodiment of the memory 104 (e.g., the storage elements 150) is depicted and generally designated 300. A second embodiment of the memory 104 (e.g., the storage elements 150) is depicted and generally designated 350.

Referring to the first embodiment 300, the storage elements 150 (e.g., memory cells or bits cells) may be formed on a substrate 382, such as the substrate 182 of FIG. 1 or the substrate 282 of FIG. 2. The storage elements 150 may include a first group of storage elements and a second group of storage elements. The first group of storage elements, such as the first group of storage elements 184 of FIG. 1, may be formed in a first group of physical layers 384. For example, the first group of physical layers 384 may include or correspond to the first group of physical layers 254 of FIG. 2. The first group of storage elements may be coupled to a first conductive channel 386. The first conductive channel 386 may include or correspond to the first conductive channel 184 of FIG. 1 and/or the first conductive channel 286 of FIG. 2.

The second group of storage elements, such as the second group of storage elements 194 of FIG. 1, may be formed in a second group of physical layers 394. For example, the second group of physical layers 394 may include or correspond to the second group of physical layers 264 of FIG. 2. The second group of storage elements may be coupled to a second conductive channel 396. The second conductive channel 396 may include or correspond to the second conductive channel 196 of FIG. 1 and/or the second conductive channel 296 of FIG. 2. It is noted that a charge trap layer, such as the first charge trap layer 170 and/or the second charge trap layer 176 of FIG. 1, is not illustrated as being coupled to the conductive channels of FIG. 3 for clarity of illustration.

An etch stop layer 390 may be positioned between the first group of physical layers 384 (e.g., the first group of storage elements) and the second group of physical layers 394 (e.g., the second group of storage elements). For example, the etch stop layer 390 may include a first surface 304 that is proximate to the first group of physical layers 384 and may include a second surface 306 that is proximate to the second group of physical layers 394. The first conductive channel 386 may be coupled (e.g., electrically coupled) to the second conductive channel 396 via a connector 392 (e.g., a landing) that extends through the etch stop layer 390.

Each of the first conductive channel 386 and the second conductive channel 396 may be substantially perpendicular relative to a surface of the substrate 382. For example, a first axis of the first conductive channel 386 may be substantially perpendicular relative to the surface of the substrate 382, and a second axis of the second conductive channel 396 may be substantially perpendicular relative to the surface of the substrate 382. The first axis and the second axis may be offset such that the first axis and the second axis are substantially parallel to each other. Although the connector 392 is illustrated as extending along the second surface 306 of the etch stop layer 390 to enable the first axis to be offset from the second axis, in other embodiments, the connector 302 may extend along the first surface 304 of the etch stop layer 390 or within the etch stop layer 390. In some embodiments, an offset distance of the first conductive channel 386 to the second conductive channel 396 may be zero, such that storage elements associated with the first group of physical layers 384 and storage elements associated with the second group of physical layers 394 are stacked on top of one another.

Referring to the second embodiment 350, the storage elements 150 are stacked in two columns, such as a first column 352 and a second column 354. The first column 352 and the second column 354 may be separated at least by one or more dielectric structures, such as a representative dielectric structure 356.

The storage elements 150 may include a third group of storage elements that may be formed in a third group of physical layers 374. The third group of physical layers 374 may be configured (and constructed) in a similar manner as the first group of physical layers 384 and the second group of physical layers 394. The third group of storage elements may be coupled to a third conductive channel 376. The third conductive channel 376 may be coupled to the first conductive channel 386 and to the second conductive channel 396. For example, the third conductive channel 376 may be coupled to the first conductive channel 286 and to the second conductive channel 396 through one or more connectors, such as the connector 392. A second etch stop layer 398 may be between the second group of physical layers 394 and the third group of physical layers 374.

A third axis of the third conductive channel 376 may be substantially perpendicular relative to the surface of the substrate 382. The third axis may be offset from the first axis (of the first conductive channel 386) and/or offset from the second axis (of the second conductive channel 396). Thus, the first axis, the second axis, and the third axis may be substantially parallel to each other.

In a particular embodiment, the first column 352 may be coupled to a first bit line and to a first source line. The second column 354 may be coupled to a second bit line and to a second source line. The first bit line may be distinct from the second bit line, and the first source line may be distinct from the second source line.

In another particular embodiment, the first column 352 and the second column 354 may be electrically coupled by a connector (not shown) that is included in the substrate. For example, when the first column 352 and the second column 354 are electrically coupled, the first column 352 and the second column 354 may form a "U" shape channel that can be coupled at one end to a bit line and at the other end to a source line.

The memory devices illustrated in FIG. 3 may include multiple conductive channels that are configured in a stacked configuration. Conductive channels (of different physical layers) that are coupled in the stacked configuration may be offset, such that the conductive channels are not aligned (or not substantially aligned, such that two adjacently stacked conductive channels do not have substantially the same vertical axis). When the conductive channels are offset, process tolerance requirements may be relaxed as compared to embodiments where the conductive channels are aligned or substantially aligned.

Figure 4:
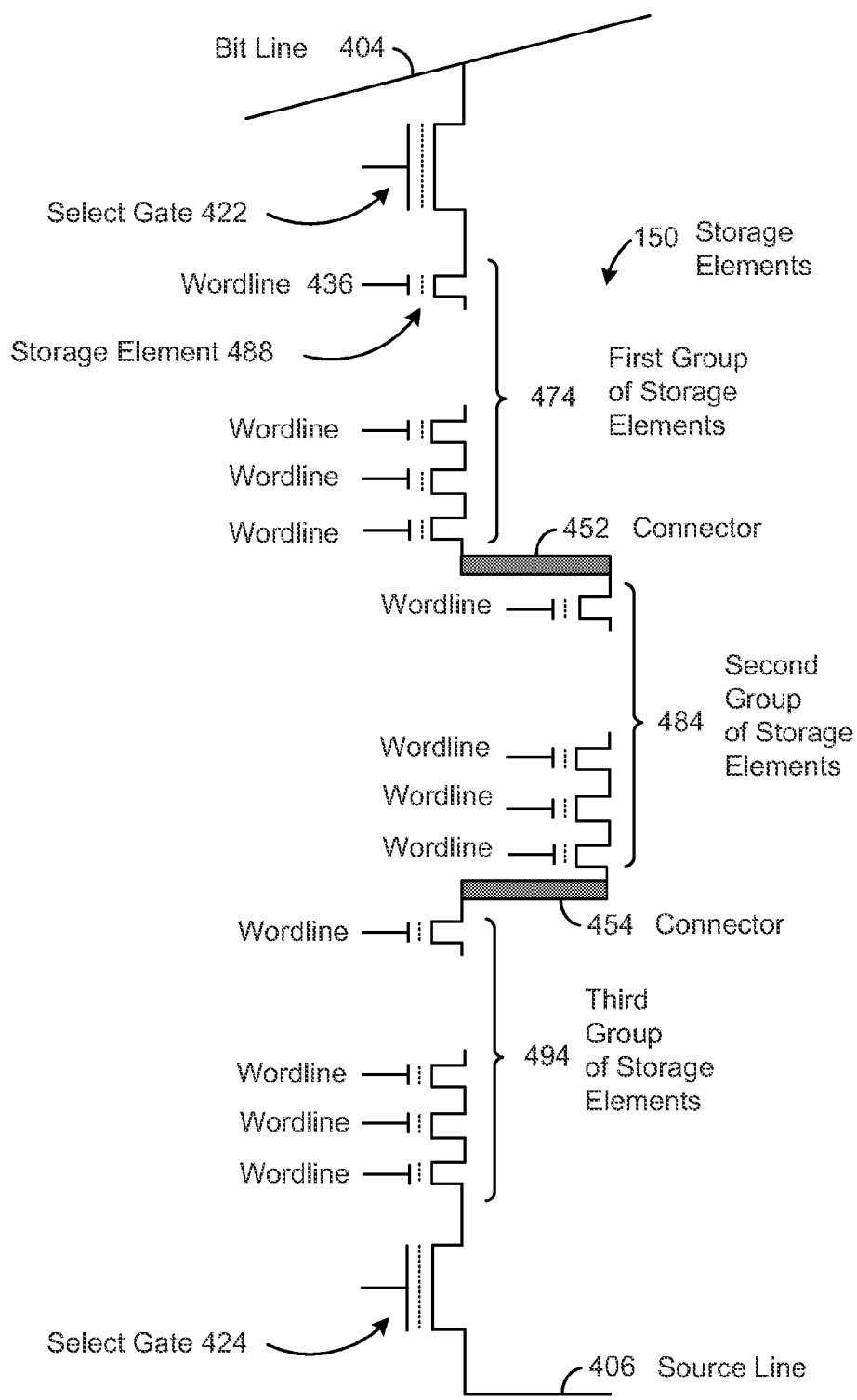
FIG. 4 is a schematic diagram of a particular embodiment of a portion of the memory device of FIG. 1.

Referring to FIG. 4, a schematic diagram of a portion of the memory 104 including the storage elements 150 of FIG. 1 is depicted and generally designated 400. The storage elements 150 may include multiple groups of storage elements. For example, the storage elements 150 may include a first group of storage elements 474, a second group of storage elements 484, and a third group of storage elements 494. Each group of storage elements 474, 484, 494 may be coupled to a corresponding conductive channel. Although FIG. 4 illustrates three groups of storage elements 474, 484, 494, the multiple groups of storage elements may include two groups of storage elements or more than three groups of storage elements.

Each group of storage elements 474, 484, 494 may include multiple storage elements that are each coupled to a corresponding wordline. For example, a representative storage element 488 may be coupled to a wordline 436. To illustrate, the storage element 488 may include or correspond to the bit cell 174 of FIG. 1. The multiple groups of storage elements may be coupled together by one or more connectors, such as the connector 192 of FIG. 1, the connector 292 of FIG. 2, and/or the connector 392 of FIG. 3. For example, the first group of storage elements 474 may be coupled to the second group of storage elements by a first connector 452, and the second group of storage elements 484 may be coupled to the third group of storage elements 494 by the a second connector 454.

The multiple groups of storage elements may be coupled to a bit line 404 and to a source line 406. For example, the multiple group of storage elements may be coupled to the bit line 404 through a first select gate 422 (e.g., a first driver), and the multiple group of storage elements may be coupled to the source line 406 through a second select gate 424 (e.g., a second driver). To illustrate, the first select gate 422 may be between the bit line 404 and the first group of storage elements 474. The second select gate 424 may be between the third group of storage elements 494 and the source line 406.

The schematic diagram 400 of the memory 104 may represent multiple conductive channels that have a stacked configuration, as described with reference to FIGS. 1-3. The connectors 452, 454 enable formation of conductive channels in the stacked configuration while preserving the integrity of different groups of physical layers and while providing electrical continuity between different conductive channels (corresponding to the different groups of storage elements)

Figure 5:
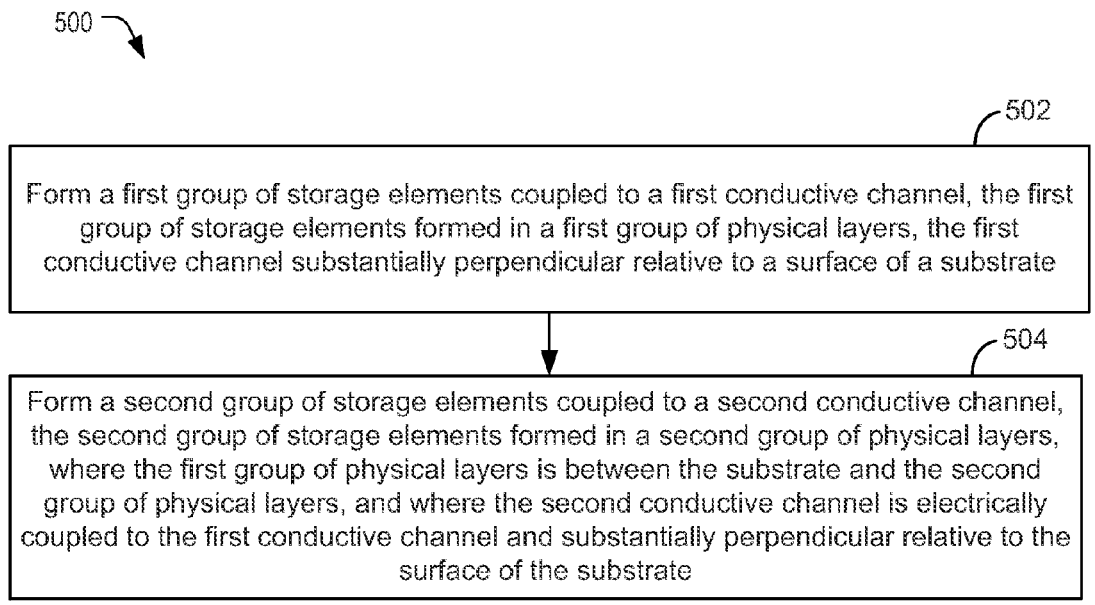
FIG. 5 is a flow diagram of a first embodiment of a method of forming the memory device of FIG. 1.

Referring to FIG. 5, a particular embodiment of a method 500 that may be performed to fabricate a memory device is depicted. For example, the method 500 may be performed to fabricate the memory 104 of FIG. 1. The memory device may have a three-dimensional (3D) memory configuration that is monolithically formed in one or more physical levels of arrays of storage elements having an active area disposed above a substrate (e.g., a silicon substrate). The substrate may include or correspond to the substrate 182 of FIG. 1, the substrate 282 of FIG. 2, or the substrate 382 of FIG. 3. The memory device may include circuitry associated with operation of the storage elements, such as read/write circuitry (e.g., the read circuitry 140 and/or the write circuitry 142 of FIG. 1).

The method 500 includes forming a first group of storage elements coupled to a first conductive channel, the first group of storage elements formed in a first group of physical layers, the first conductive channel substantially perpendicular relative to a surface of a substrate, at 502. After the first group of storage elements is formed, an exposed surface of a physical layer associated with the first group of storage elements may be planarized. As an example, the first group of storage elements may include or correspond to the first group of storage elements 184 of FIG. 1, and the first channel may include or correspond to the first conductive channel 186. As another example, the first group of storage elements and the first conductive channel may include or correspond to storage elements included in in the first group of physical layers 254 of FIG. 2, and the first conductive channel may include or correspond to the first conductive channel 286 or the other conductive channel 287 of FIG. 2. As another example, the first group of storage elements may include or correspond to storage elements included in the first group of physical layers 384 of FIG. 3, and the first conductive channel may include or correspond to the first conductive channel 386 of FIG. 3. As another example, the first group of storage elements may include or correspond to storage elements included in the second group of physical layers 394 of FIG. 3, and the first conductive channel may include or correspond to the second conductive channel 396 of FIG. 3. As another example, the first group of storage elements may include or correspond to the first group of storage elements 474, the second group of storage elements 484, or the third group of storage elements 494 of FIG. 4.

The method 500 further includes forming a second group of storage elements coupled to a second conductive channel, the second group of storage elements formed in a second group of physical layers, where the first group of physical layers is between the substrate and the second group of physical layers, and where the second conductive channel is electrically coupled to the first conductive channel and substantially perpendicular relative to the surface of the substrate, at 504. The second group of storage elements may be formed above the first group of storage elements relative to the surface of the substrate. The second conductive channel may be offset from (e.g., substantially parallel to, but not aligned with) the first conductive channel. The second conductive channel may be offset from the first conductive channel when a vertical axis of the second conductive channel is substantially parallel (e.g., generally parallel within manufacturing and/or fabricating tolerances and errors) to, but not aligned with (e.g., the same as) a vertical axis of the first conductive channel. Alternatively, the second conductive channel may be aligned with and/or substantially aligned with the first conductive channel. For example, a vertical axis of the second conductive channel may be aligned with (e.g., the same as) and/or substantially aligned with (e.g., generally the same within manufacturing and/or fabricating tolerances and errors) a vertical axis of the first conductive channel.

As an example, the second group of storage elements may include or correspond to the second group of storage elements 194 of FIG. 1, and the second conductive channel may include or correspond to the second conductive channel 196 of FIG. 1. As another example, the second group of storage elements and the first conductive channel may include or correspond to storage elements included in in the second group of physical layers 264 of FIG. 2, and the second conductive channel may include or correspond to the second conductive channel 296 or the conductive channel 297 of FIG. 2. As another example, the second group of storage elements may include or correspond to storage elements included in the second group of physical layers 394 of FIG. 3, and the second conductive channel may include or correspond to the second conductive channel 396 of FIG. 3. As another example, the second group of storage elements may include or correspond to storage elements included in the third group of physical layers 374 of FIG. 3, and the second conductive channel may include or correspond to the third conductive channel 376 of FIG. 3. As another example, the second group of storage elements may include or correspond to another one of the groups of storage elements 474, 484, 494 of FIG. 4.

In some implementations, an etch stop layer may be formed, prior to forming the second group of storage elements, above the first group of storage elements. For example, the etch stop layer may include or correspond to the etch stop layer 190 of FIG. 1, the etch stop layer 290 of FIG. 2, the etch stop layer 390, or the second etch stop layer 398 of FIG. 3. The second group of storage elements may be formed above the etch stop layer relative to the surface of the substrate. To illustrate, after the second group of storage elements are formed, the etch stop layer may be between the first group of storage elements and the second group of storage elements. In other implementations, the second group of storage elements may be formed without an etch stop layer between the first group of physical layers and the second group of physical layers. For example, when the first conductive channel and the second conductive channel are aligned, an etch of the second group of physical layers may be controlled to stop at a top of the first group of physical layers, or may be allowed to continue into the dielectric structure of the first physical layers and may be repaired when filling in the dielectric structure of the second physical layers.

In some implementations, a connector (e.g., a landing) is formed to couple the first conductive channel and the second conductive channel. For example, the connector may include or correspond to the connector 192 of FIG. 1, the connector 292 of FIG. 2, the connector 392 of FIG. 3, the first connector 452, or the second connector 454 of FIG. 4. The connector may be formed prior to forming the second group of storage elements and may be in contact with the first conductive channel. The second conductive channel may be formed to be in contact (e.g., direct contact) with the contact (e.g., the landing). In other implementations, a connector is not formed to couple the first conductive channel to the second conductive channel. For example, the second channel may be formed by etching a hole in the second group of physical layers to expose a metal of the first conductive channel. The hole may be filled with a metal to contact the top of the first conductive channel and thereby (electrically) couple the first conductive channel to the second conductive channel.

In some implementations, forming the second group of storage elements may include forming the second group of physical layers and etching the second group of physical layers to form a cavity. After forming the cavity, a charge trap layer, such as the first charge trap layer 170 or the second charge trap layer 176 of FIG. 1, may be formed in the cavity. After the charge trap layer is formed, the second conductive channel may be formed in the cavity. In other implementations, after forming the cavity, the second conductive channel may be formed in the cavity prior to forming the charge trap layer. For example, after the conductive channel is formed in the cavity, one or more dummy wordline layers may be etched (e.g., removed) and the charge trap layer may be formed around the exposed conductive channel. After the charge trap layer is formed, a wordline layer may be formed around each charge trap layer.

By stacking multiple conductive channels in a memory device, a number of physical layers (and a number of storage elements) that may be stacked is not limited by a number of layers through which a hole for a particular conductive channel may be formed. Additionally, the method 500 enables the first conductive channel and the second conductive channel to be formed in the stacked configuration while preserving the integrity of the first group of physical layers and while providing electrical continuity between the first conductive channel and the second conductive channel.

Figure 6:
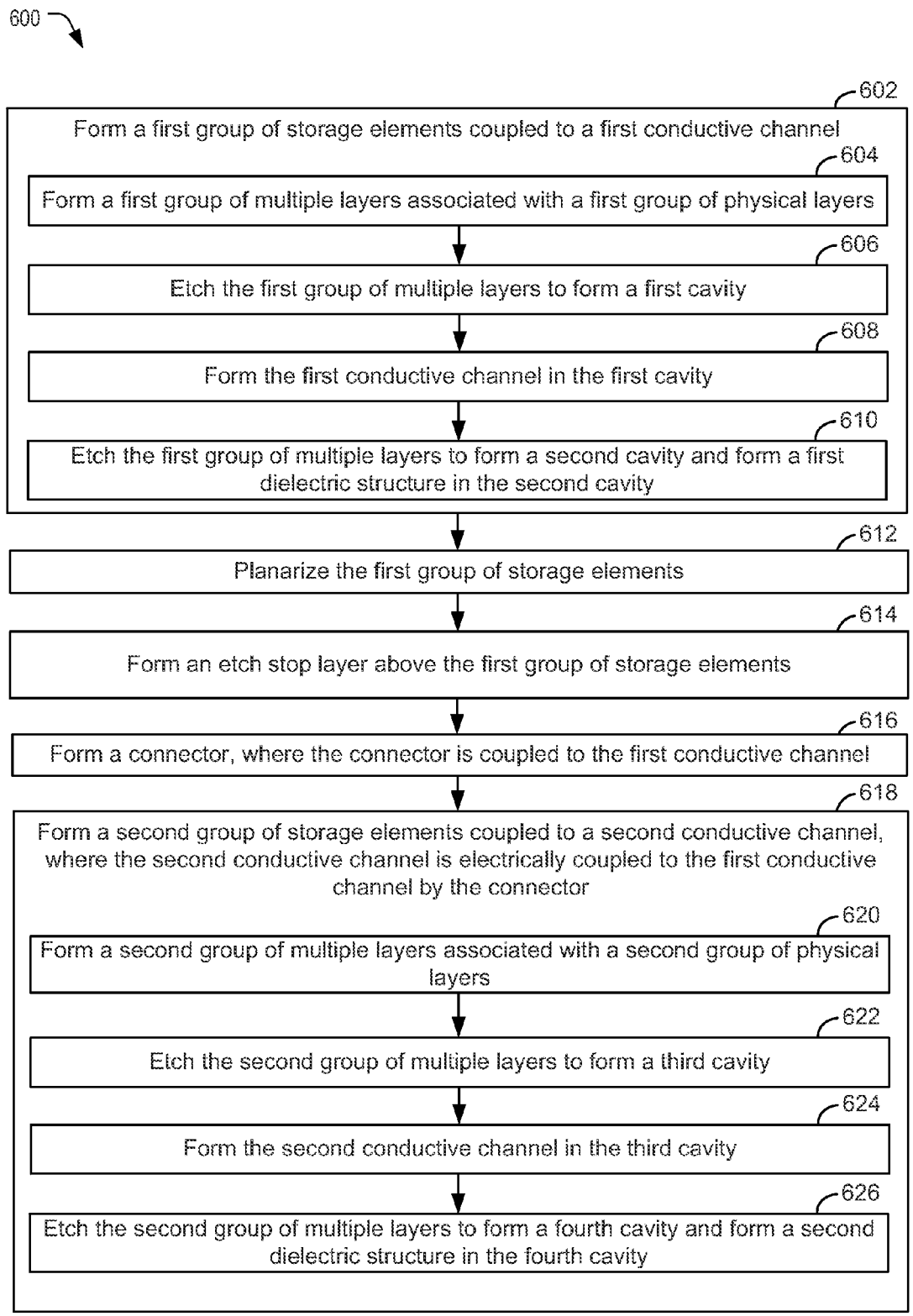
FIG. 6 is a flow diagram of a second embodiment of a method of forming the memory device of FIG. 1.

Referring to FIG. 6, a particular embodiment of a method 600 that may be performed to fabricate a memory device is depicted. For example, the method 600 may be performed to fabricate the memory 104 of FIG. 1. The memory device may have a three-dimensional (3D) memory configuration that is monolithically formed in one or more physical levels of arrays of storage elements having an active area disposed above a substrate (e.g., a silicon substrate). The substrate may include or correspond to the substrate 182 of FIG. 1, the substrate 282 of FIG. 2, or the substrate 382 of FIG. 3. The memory device may include circuitry associated with operation of the storage elements, such as read/write circuitry (e.g., the read circuitry 140 and/or the write circuitry 142 of FIG. 1).

The method 600 includes forming a first group of storage elements coupled to a first conductive channel, at 602. The first group of storage elements may be formed above the substrate relative to a surface of the substrate. The first conductive channel may be substantially perpendicular relative to the surface of the substrate. As an example, the first group of storage elements may include or correspond to the first group of storage elements 184 of FIG. 1, and the first channel may include or correspond to the first conductive channel 186. As another example, the first group of storage elements and the first conductive channel may include or correspond to storage elements included in in the first group of physical layers 254 of FIG. 2, and the first conductive channel may include or correspond to the first conductive channel 286 or the conductive channel 287 of FIG. 2. As another example, the first group of storage elements may include or correspond to storage elements included in the first group of physical layers 384 of FIG. 3, and the first conductive channel may include or correspond to the first conductive channel 386 of FIG. 3. As another example, the first group of storage elements may include or correspond to storage elements included in the second group of physical layers 394 of FIG. 3, and the first conductive channel may include or correspond to the second conductive channel 396 of FIG. 3. As another example, the first group of storage elements may include or correspond to the first group of storage elements 474, the second group of storage elements 484, or the third group of storage elements 494 of FIG. 4.

Forming the first group of storage elements may include forming a first group of multiple layers associated with a first group of physical layers, at 604, etching the first group of multiple layers to form a first cavity, at 606, and forming the first conductive channel in the first cavity, at 608. The first cavity (e.g., a hole) may have a substantially cylindrical shape and/or may have a substantially consistent diameter through the first group of multiple layers. The first group of multiple layers may include a conductive layer, such as the conductive layer 260 of FIG. 2, and/or a dielectric layer, such as the dielectric layer 262 of FIG. 2. Prior to forming the first conductive channel in the first cavity, a first charge trap layer, such as the first charge trap layer 170 of FIG. 1, may be deposited in the first cavity. The first group of physical layers may include or correspond to the first group of physical layers 254, the second group of physical layers 264 of FIG. 2, the first group of physical layers 384, the second group of physical layers 394, or the third group of physical layers 374 of FIG. 3.

Forming the first group of storage elements may further include etching the first group of multiple layers to form a second cavity (or trench) and forming a first dielectric structure in the second cavity, at 610. The first dielectric structure may include or correspond to the first dielectric structure 294, the second dielectric structure 298 of FIG. 3, or the dielectric structure 356 of FIG. 3.

The method 600 may further include planarizing an upper surface of the group of multiple layers that includes the first group of storage elements, at 612, and forming an etch stop layer above the first group of storage elements, at 614. The etch stop layer may be formed on at least a portion of a planarized surface of the first group of storage elements. The etch stop layer may include or correspond to the etch stop layer 190 of FIG. 1, the etch stop layer 290 of FIG. 2, the etch stop layer 390, or the second etch stop layer 398 of FIG. 3.

The method 600 may also include forming a connector, where the connector is coupled to the first conductive channel, at 616. The connector may extend through the etch stop layer. The connector may include or correspond to the connector 192 of FIG. 1, the connector 292 of FIG. 2, the connector 392 of FIG. 3, the first connector 452, or the second connector 454 of FIG. 4.

The method 600 may also include forming a second group of storage elements coupled to a second conductive channel, where the second conductive channel is electrically coupled to the first conductive channel by the connector, where the connector is coupled to the first conductive channel, at 618. The second group of storage elements may be formed above the first group of storage elements relative to the surface of the substrate. The second conductive channel may be offset from (e.g., not aligned with) the first conductive channel.

The second group of storage elements may include or correspond to the second group of storage elements 194 of FIG. 1, and the second conductive channel may include or correspond to the second conductive channel 196 of FIG. 1. As another example, the second group of storage elements may include or correspond to storage elements included in in the second group of physical layers 264 of FIG. 2, and the second conductive channel may include or correspond to the second conductive channel 296 or the conductive channel 297 of FIG. 2. As another example, the second group of storage elements may include or correspond to storage elements included in the second group of physical layers 394 of FIG. 3, and the second conductive channel may include or correspond to the second conductive channel 396 of FIG. 3. As another example, the second group of storage elements may include or correspond to storage elements included in the third group of physical layers 374 of FIG. 3, and the second conductive channel may include or correspond to the third conductive channel 376 of FIG. 3. As another example, the second group of storage elements may include or correspond to the second group of storage elements 484 or the third group of storage elements 494 of FIG. 4.

Forming the second group of storage elements may include forming a second group of multiple layers associated with a second group of physical layers, at 620, etching the second group of multiple layers to form a third cavity, at 622, and forming the second conductive channel in the third cavity, at 624. The second group of multiple layers may include a conductive layer, such as the conductive layer 260 of FIG. 2, and/or a dielectric layer, such as the dielectric layer 262 of FIG. 2. Prior to forming the second conductive channel in the third cavity, a second charge trap layer, such as the second charge trap layer 176 of FIG. 1, may be deposited in the third cavity. The second group of physical layers may include or correspond to the first group of physical layers 254, the second group of physical layers 264 of FIG. 2, the second group of physical layers 394, or the third group of physical layers 374 of FIG. 3.

Forming the second group of storage elements may further include etching the second group of multiple layers to form a fourth cavity (or trench) and forming a second dielectric structure in the fourth cavity, at 626. The second dielectric structure may include or correspond to the first dielectric structure 294, the second dielectric structure 298 of FIG. 3, or the dielectric structure 356 of FIG. 3. The first conductive channel and the second conductive channel may be coupled in a stacked configuration to form a portion of a column of "stacked" storage elements.

The first group of storage elements and the second group of storage elements may each include less than or equal to "n" storage elements, where n is a positive integer. A value of n may correspond to an upper limit of the number of layers of a group of multiple layers (e.g., physical layers) that may be etched to form a cavity (e.g., a hole) having a substantially cylindrical shape and/or a substantially consistent diameter through the group of multiple layers. For example, n may have a value of twenty-four, as an illustrative, non-limiting example. Based on n being equal to twenty-four, each of the first group of storage elements and the second group of storage elements may include less than or equal to twenty-four storage elements. To illustrate, each of the first group of storage elements and the second group of storage elements may include eighteen to twenty storage elements. As an illustrative, non-limiting example, when n=24 (i.e., an etch depth limitation of 24) and when each of the first group of physical layers and the second group of physical layers has 18 layers, the total number of layers would be 36 layers (i.e., a value greater than n=24). Accordingly, because each storage element is formed in a corresponding physical layer (e.g., a conductive wordline layer separated from wordline layers above and/or below by a dielectric layer), each of the first group of physical layers and the second group of physical layers may include less than or equal to twenty-four physical layers. In a particular embodiment, a combination of the first group of physical layer and the second group of physical layers may include a total number of physical layers that is more than twenty-four physical layers. Although the first group of storage elements and the second group of storage elements have been described as including the same number of storage element, the first group of storage elements and the second group of storage elements may each have a different number of storage elements.

By stacking multiple conductive channels, a total number of storage elements (e.g., a total number of physical layers) that may be stacked to form a column is not limited by a number of layers through which a hole for a particular conductive channel may be formed. Accordingly, a number of storage elements included in the column of stacked storage elements may not be limited by a number of layers (e.g., physical layers) through which a hole for a conductive channel may be formed The method 500 of FIG. 5 and/or the method 600 of FIG. 6 may be initiated or controlled by an application-specific integrated circuit (ASIC), a processing unit, such as a central processing unit (CPU), a digital signal processor (DSP), a controller, another hardware device, a firmware device, a field-programmable gate array (FPGA) device, or any combination thereof. As an example, the method 500 of FIG. 5 and/or the method 600 of FIG. 6 can be initiated or controlled by one or more processors, such as one or more processors included in or coupled to a controller. A controller configured to perform the method 500 of FIG. 5 and/or the method 600 of FIG. 6 may be able to form a three dimensional memory device having stacked conductive channels, such as the memory 104 of FIG. 1.

Figure 7:
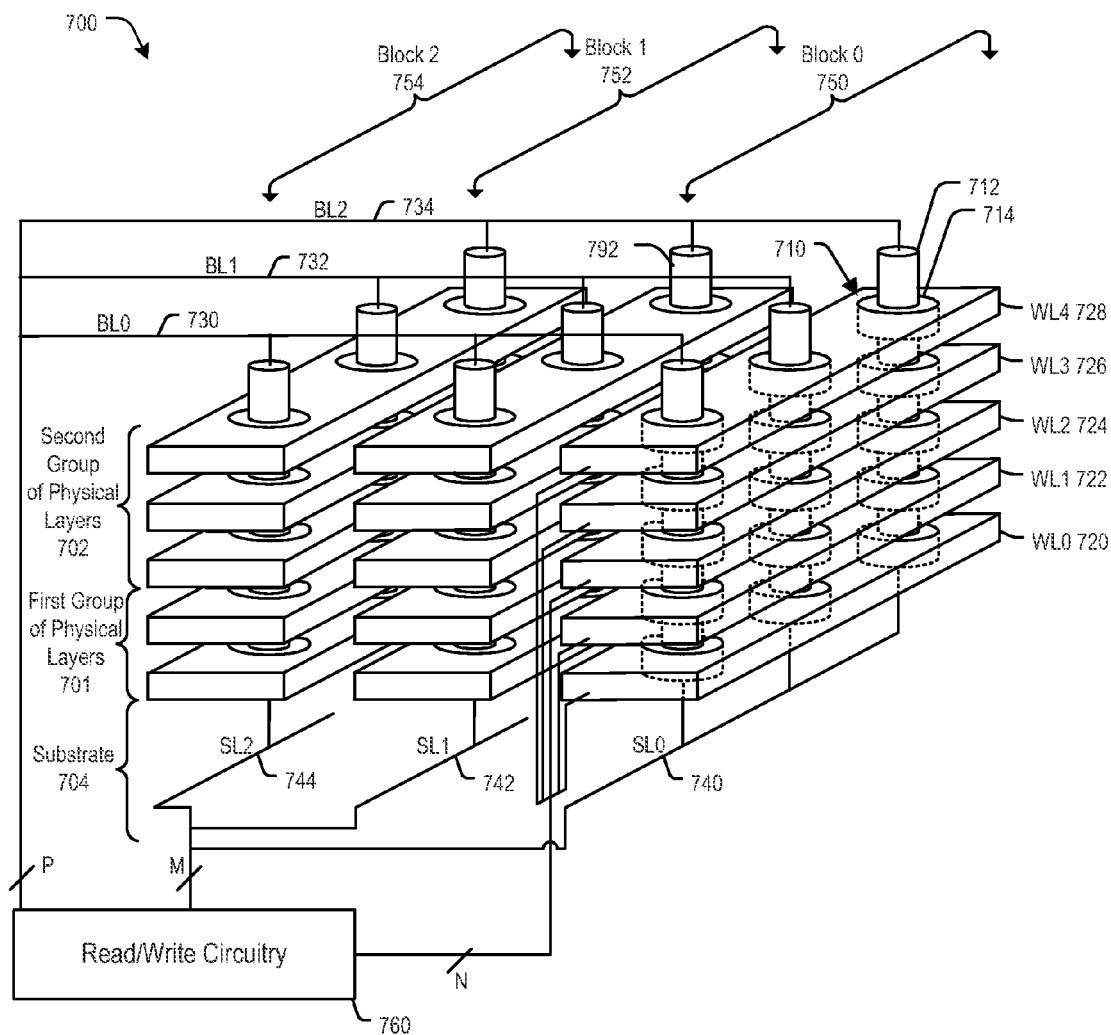
FIG. 7 is a block diagram of a particular embodiment of the memory device of FIG. 1.

FIG. 7 illustrates an embodiment of a 3D memory 700 in a NAND flash configuration. The 3D memory 700 may correspond to the memory 104 of FIG. 1. The 3D memory 700 includes multiple physical layers, such as a first group of physical layers 701 and a second group of physical layers 702, that are monolithically formed above a substrate 704, such as a silicon substrate. The multiple physical layers may include or correspond to a first group of physical layers that include the first group of storage elements 184, a second group of physical layers that include the second group of storage elements 194, the first group of physical layers 254, the second group of physical layers 264, the first group of physical layers 384, the second group of physical layers 394, or the third group of physical layers 374. Storage elements (e.g., memory cells), such as a representative memory cell 710, are arranged in arrays in the physical layers.

The representative memory cell 710 includes a charge trap structure 714 between a wordline/control gate (WL4) 728 and a conductive channel 712. The charge trap may include or correspond to the first charge trap layer 170 or the second charge trap layer 176 of FIG. 1. Charge may be injected into or drained from the charge trap structure 714 via biasing of the conductive channel 712 relative to the wordline 728. For example, the charge trap structure 714 may include silicon nitride and may be separated from the wordline 728 and the conductive channel 712 by a gate dielectric, such as a silicon oxide. An amount of charge in the charge trap structure 714 affects an amount of current through the conductive channel 712 during a read operation of the memory cell 710 and indicates one or more bit values that are stored in the memory cell 710. The conductive channel 712 may include or correspond to the first conductive channel 186, the second conductive channel 196, the first conductive channel 286, the second conductive channel 296, the first conductive channel 386, the second conductive channel 396, or the third conductive channel 376.

The 3D memory 700 includes multiple erase blocks, including a first block (block 0) 750, a second block (block 1) 752, and a third block (block 2) 754. Each block 750-754 includes a "vertical slice" of the physical layers 702 that includes a stack of wordlines, illustrated as a first wordline (WL0) 720, a second wordline (WL1) 722, a third wordline (WL2) 724, a fourth wordline (WL3) 726, and the fifth wordline (WL4) 728. Multiple conductive channels (having a substantially vertical orientation with respect to FIG. 7) extend through the stack of wordlines. Each conductive channel is coupled to a storage element in each wordline 720-728, forming a NAND string of storage elements. FIG. 7 illustrates three blocks 750-754, five wordlines 720-728 in each block, and three conductive channels in each block for clarity of illustration. However, the 3D memory 700 may have more than three blocks, more than five wordlines per block, and more than three conductive channels per block.

Read/write circuitry 760 is coupled to the conductive channels via multiple conductive lines, illustrated as a first bit line (BL0) 730, a second bit line (BL1) 732, and a third bit line (BL2) 734 at a "top" end of the conducive channels (e.g., farther from the substrate 704) and a first source line (SL0) 740, a second source line (SL1) 742, and a third source line (SL2) 744) at a "bottom" end of the conductive channels (e.g., nearer to or within the substrate 704). The read/write circuitry 760 is illustrated as coupled to the bit lines 730-734 via "P" control lines, coupled to the source lines 740-744 via "M" control lines, and coupled to the wordlines 720-728 via "N" control lines. Each of P, M, and N may have a positive integer value based on the specific configuration of the 3D memory 700. In the illustrative example of FIG. 7, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 792 and a particular source line may be coupled to the top of the conductive channel 712. The bottom of the conductive channel 792 may be coupled (e.g., electrically coupled) to the bottom of the conductive channel 712. Accordingly, the conductive channel 792 and the conductive channel 712 may be coupled in series and may be coupled to the particular bit line and the particular source line.

Although each of the conductive channels, such as the conductive channels 712, 792, is illustrated as a single conductive channel, each of the conductive channels may include multiple conductive channels that are in a stack configuration. The multiple conductive channels in a stacked configuration may be coupled by one or more connectors, such the connector 192 of FIG. 1, the connector 292 of FIG. 2, the connector 392 of FIG. 3, the first connector 452, or the second connector 454 of FIG. 4. Additionally, an etch stop layer may be between each conductive channel included in the multiple conductive channels, as described with reference to FIGS. 1-3.

The read/write circuitry 760 may operate as described with respect to the read circuitry 140 and/or the write circuitry 142 of FIG. 1. For example, data may be stored to storage elements coupled to the wordline 728 and the read/write circuitry 760 may read bit values from the storage elements. As another example, the read/write circuitry 760 may apply selection signals to control lines coupled to the wordlines 720-728, the bit lines 730-734, and the source lines 740-742 to cause a programming voltage (e.g., a voltage pulse or series of voltage pulses) to be applied across selected storage element(s) of the selected wordline (e.g., the fourth wordline 728).

During a read operation, the controller 120 may receive a request from a host device, such as the host device 130 of FIG. 1. The controller 120 may cause the read/write circuitry 760 to read bits from particular storage elements of the 3D memory 700 by applying appropriate signals to the control lines to cause storage elements of a selected wordline to be sensed. Accordingly, the 3D memory 700 having multiple conductive channels in a stacked configuration may be configured to read from and write data to one or more storage elements.

Figure 8:
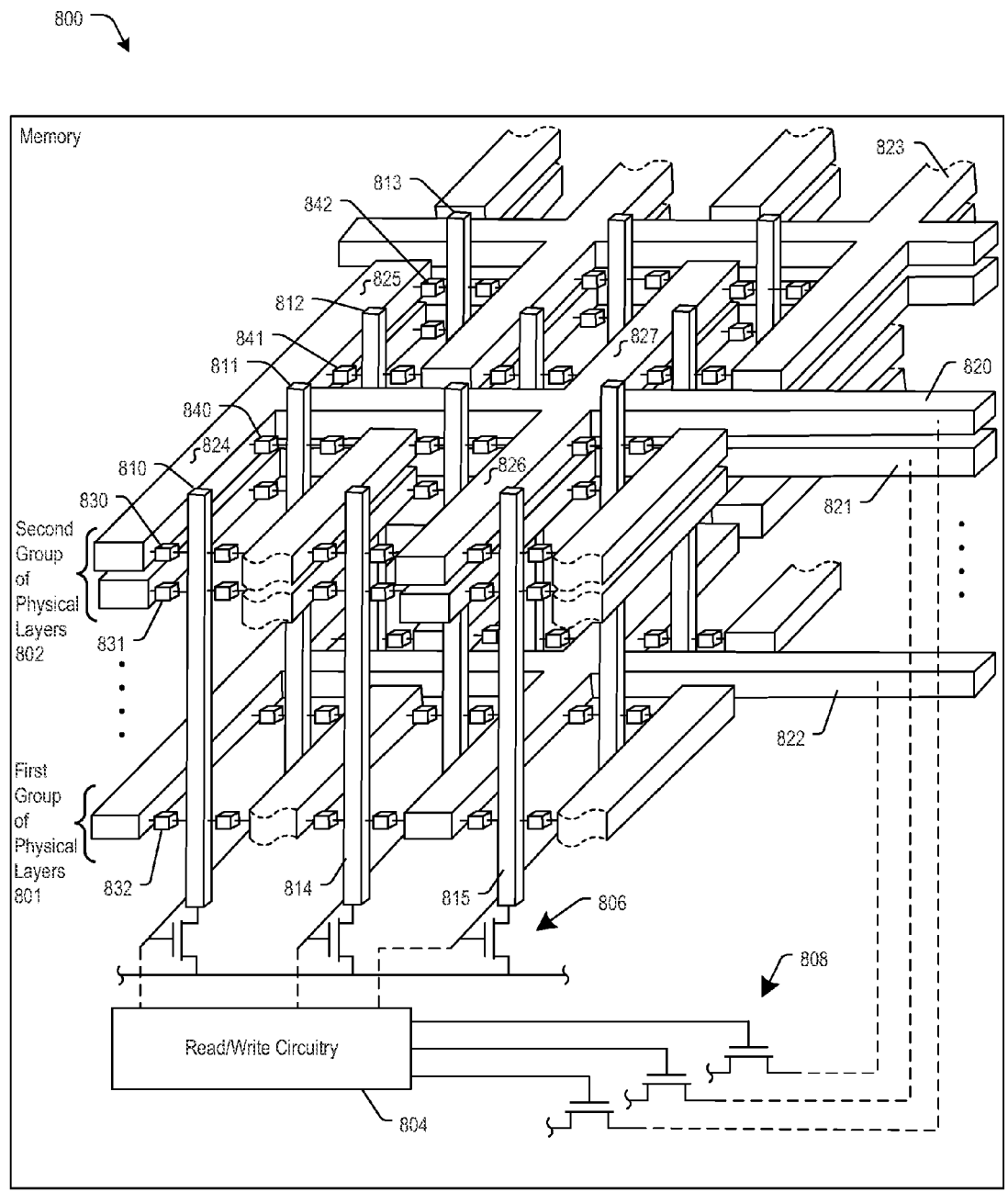
FIG. 8 is a block diagram of another particular embodiment of the memory device of FIG. 1.

FIG. 8 is a diagram of a particular embodiment of a memory 800. The memory 800 may be included in the data storage device 102 of FIG. 1. FIG. 8 illustrates a portion of a three-dimensional architecture of the memory 800, such as the memory 104. In the embodiment illustrated in FIG. 8, the memory is a vertical bit line Resistive Random Access Memory (ReRAM) with a plurality of conductive lines in physical layers over a substrate (e.g., substantially parallel to a surface of the substrate), such as representative wordlines 820, 821, 822, and 823 (only a portion of which is shown in FIG. 8) and a plurality of vertical conductive lines through the physical layers, such as representative bit lines 810, 811, 812, and 813. The wordline 822 may include or correspond to a first group of physical layers 801 and the wordlines 820, 821 may include or correspond to a second group of physical layers 802. The first group of physical layers 801 and the second group of physical layers 802 may include or correspond to the first group of physical layers 254, the second group of physical layers 264 of FIG. 2, or two adjacent groups of physical layers of the first group of physical layers 384, the second group of physical layers 394, or the third group of physical layers 374 of FIG. 3.

Although each of the bit lines, such as the bit lines 810, 811, 812, and 813, are illustrated as a single bit line, each of the bit lines 810, 811, 812, and 813 may include multiple portions that are in a stacked configuration. The multiple portions in a stacked configuration may be coupled by one or more connectors, such as the connector 192 of FIG. 1, the connector 292 of FIG. 2, the connector 392 of FIG. 3, the first connector 452, or the second connector 454 of FIG. 4. Additionally, an etch stop layer may be between each portion of the multiple portions.

The memory 800 also includes a plurality of resistance-based storage elements (e.g., memory cells), such as representative storage elements 830, 831, 832, 840, 841, and 842, each of which is coupled to a bit line and a wordline in arrays of memory cells in multiple physical layers over the substrate (e.g., a silicon substrate). The memory 800 also includes read/write circuitry 804, such as the read circuitry 140 and/or the write circuitry 142 of FIG. 1. The read/write circuitry 804 is coupled to wordline drivers 808 and bit line drivers 806.

In the embodiment illustrated in FIG. 8, each of the wordlines includes a plurality of fingers (e.g., a first wordline 820 includes fingers 824, 825, 826, and 827). Each finger may be coupled to more than one bit line. To illustrate, a first finger 824 of the first wordline 820 is coupled to a first bit line 810 via a first storage element 830 at a first end of the first finger 824 and is coupled to a second bit line 811 via a second storage element 840 at a second end of the first finger 824.

In the embodiment illustrated in FIG. 8, each bit line may be coupled to more than one wordline. To illustrate, the first bit line 810 is coupled to the first wordline 820 via the first storage element 830 and is coupled to a third wordline 822 via a third storage element 832.

During a write operation, the controller 120 may receive data from a host device, such as the host device 130 of FIG. 1. The controller 120 may send the data (or a representation of the data) to the memory 800. For example, the controller 120 may encode the data prior to sending the encoded data to the memory 800.

The read/write circuitry 804 may write the data to storage elements corresponding to the destination of the data. For example, the read/write circuitry 804 may apply selection signals to selection control lines coupled to the wordline drivers 808 and the bit line drivers 806 to cause a write voltage to be applied across a selected storage element. For example, to select the first storage element 830, the read/write circuitry 804 may activate the wordline drivers 808 and the bit line drivers 806 to drive a programming current (also referred to as a write current) through the first storage element 830. To illustrate, a first write current may be used to write a first logical value (e.g., a value corresponding to a high-resistance state) to the first storage element 830, and a second write current may be used to write a second logical value (e.g., a value corresponding to a low-resistance state) to the first storage element 830. The programming current may be applied by generating a programming voltage across the first storage element 830 by applying a first voltage to the first bit line 810 and to wordlines other than the first wordline 820 and applying a second voltage to the first wordline 820. In a particular embodiment, the first voltage is applied to other bit lines (e.g., the bit lines 814, 815) to reduce leakage current in the memory 800.

During a read operation, the controller 120 may receive a request from a host device, such as the host device 130 of FIG. 1. The controller 120 may cause the read/write circuitry 804 to read bits from particular storage elements of the memory 800 by applying selection signals to selection control lines coupled to the wordline drivers 808 and the bit line drivers 806 to cause a read voltage to be applied across a selected storage element. For example, to select the first storage element 830, the read/write circuitry 804 may activate the wordline drivers 808 and the bit line drivers 806 to apply a first voltage (e.g., 0.7 volts (V)) to the first bit line 810 and to wordlines other than the first wordline 820. A lower voltage (e.g., 0 V) may be applied to the first wordline 820. Thus, a read voltage is applied across the first storage element 830, and a read current corresponding to the read voltage may be detected at a sense amplifier of the read/write circuitry 804.

The read current corresponds (via Ohm's law) to a resistance state of the first storage element 830, which corresponds to a logical value stored at the first storage element 830. The logical value read from the first storage element 830 and other elements read during the read operation may be provided to the controller 120. Accordingly, each of the bit lines 810, 811, 812, and 813 may include multiple portions and the multiple portions of a particular bit line may be in a stacked configuration.

A memory having a three dimensional configuration including stacked conductive channels may be manufactured using a fabrication process, such as a fabrication process that includes or corresponds to the process illustrated in FIG. 2, the method 500 of FIG. 5 and/or the method 600 of FIG. 6, or a combination thereof. A processor and a memory may initiate and/or control the fabrication process. The memory may include executable instructions such as computer-readable instructions or processor-readable instructions. The executable instructions may include one or more instructions that are executable by a computer, such as a computer that includes the processor and the memory.

The fabrication process may be implemented by a fabrication system that is fully automated or partially automated. For example, the fabrication process may be automated according to a schedule. The fabrication system may include fabrication equipment (e.g., processing tools) to perform one or more operations to form a memory device. For example, the fabrication equipment may be configured to deposit one or more materials (e.g., layers), etch the one or more layers, deposit an etch stop layer, form a connector, deposit a charge trap layer, form a conductive channel, perform planarization, etc.

The fabrication system (e.g., an automated system that performs the fabrication process) may have a distributed architecture (e.g., a hierarchy). For example, the fabrication system may include one or more processors, one or more memories, and/or controllers that are distributed according to the distributed architecture. The distributed architecture may include a high-level processor that controls or initiates operations of one or more low-level systems. For example, a high-level portion of the fabrication system may include one or more processors and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data to the particular high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include one or more processors.

To illustrate, a processor of the fabrication system may be a part of a high-level system, subsystem, or component of the fabrication system. In another embodiment, the processor of the fabrication system includes or is associated with distributed processing at various levels and components of a fabrication system.

Thus, a processor of the fabrication system may include or have access to processor-executable instructions that, when executed by the processor, cause the processor to initiate or control formation of a memory device, the memory device formed by forming a first group of storage elements coupled to a first conductive channel, the first conductive channel substantially perpendicular relative to a surface of a substrate, and by forming a second group of storage elements coupled to a second conductive channel, the second conductive channel electrically coupled to the first conductive channel and substantially perpendicular relative to the surface of the substrate. The memory device may include a non-volatile memory having a three-dimensional (3D) memory configuration that is monolithically formed in one or more physical levels of arrays of storage elements having an active area disposed above the substrate. For example, the first group of storage elements may be formed by one or more deposition tools, such as a molecular beam epitaxial growth tool, a flowable chemical vapor deposition (FCVD) tool, a conformal deposition tool, or a spin-on deposition tool, and by one or more etch removal tools, such as a chemical removal tool. As another example, the second group of storage elements may be formed by one or more deposition tools, such as a molecular beam epitaxial growth tool, a flowable chemical vapor deposition (FCVD) tool, a conformal deposition tool, or a spin-on deposition tool, and by one or more etch removal tools, such as a chemical removal tool.

The executable instructions included in the memory of the fabrication system may enable the processor of the fabrication system to initiate formation of a memory device, such as the memory 104 of FIG. 1 that includes a three dimensional configuration and stacked conductive channels. In a particular embodiment, the memory of the fabrication system stores computer-executable instructions that are executable by the processor to cause the processor to initiate formation of the memory 104 of FIG. 1, in accordance with at least a portion of any of the processes illustrated FIG. 2, at least a portion of any of the methods of FIGS. 5 and 6, or any combination thereof. For example, the computer executable instructions may be executable to cause the processor to initiate formation of the memory device, such as the memory 104 of FIG. 1 that includes a three dimensional configuration and stacked conductive channels. The memory device may be formed by forming a first group of storage elements coupled to a first conductive channel, the first conductive channel substantially perpendicular relative to a surface of a substrate, and by forming a second group of storage elements coupled to a second conductive channel, the second conductive channel electrically coupled to the first conductive channel and substantially perpendicular relative to the surface of the substrate. For example, the memory device may include a non-volatile memory having a three-dimensional (3D) memory configuration that is monolithically formed in one or more physical levels of arrays of storage elements having an active area disposed above the substrate.

Although various components depicted herein are illustrated as block components and described in general terms, such components may include one or more microprocessors, state machines, or other circuits configured to enable the data storage device 102 to perform one or more operations described herein. For example, the controller 120 and/or the memory (e.g., the read circuitry 140, and/or the write circuitry 142) may represent physical components, such as hardware controllers, state machines, logic circuits, or other structures, to enable reading data from and writing data to the memory 104.

Alternatively, or in addition, one or more components of the data storage device 102 may be implemented using a microprocessor or microcontroller programmed to perform one or more operations described herein. To illustrate, operations corresponding to the controller 120, the read circuitry 140, and/or the write circuitry 142 may be implemented using a processor that executes instructions, as illustrative examples. In a particular embodiment, the instructions are stored at the memory 104. Alternatively, or in addition, executable instructions that are executed by the processor may be stored at a separate memory location that is not part of the memory 104, such as at a read-only memory (ROM).

In a particular embodiment, the data storage device 102 may be attached to or embedded within one or more host devices, such as within a housing of a host communication device, which may correspond to the host device 130. The data storage device 102 may be within a packaged apparatus such as a wireless telephone, a personal digital assistant (PDA), a gaming device or console, a portable navigation device, a computer device (e.g., a tablet or a laptop), or other device that uses internal non-volatile memory. However, in other embodiments, the data storage device 102 may be a portable device configured to be selectively coupled to one or more external devices, such as the host device 130. For example, the data storage device 102 may be a removable device such as a Universal Serial Bus (USB) flash drive or a removable memory card, as illustrative examples.

The host device 130 may correspond to a mobile telephone, a music player, a video player, a gaming device or console, an electronic book reader, a personal digital assistant (PDA), a computer, such as a laptop, a tablet, or a notebook computer, a portable navigation device, another electronic device, or a combination thereof. The host device 130 may communicate via a host controller, which may enable the host device 130 to communicate with the data storage device 102. The host device 130 may operate in compliance with a JEDEC Solid State Technology Association industry specification, such as an embedded MultiMedia Card (eMMC) specification or a Universal Flash Storage (UFS) Host Controller Interface specification. The host device 130 may operate in compliance with one or more other specifications, such as a Secure Digital (SD) Host Controller specification, as an illustrative example. Alternatively, the host device 130 may communicate with the data storage device 102 in accordance with another communication protocol.

A memory may have a two-dimensional configuration, a three-dimensional (3D) configuration (e.g., a 3D memory), or any other configuration, and may include a single die or multiple dies (e.g., multiple stacked memory dies). For example, the memory 104 may have a 3D configuration and may include a single die or multiple dies. The data storage device 102 may be configured to be coupled to the host device 130 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

Semiconductor memory devices, such as the memory 104, include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., in a NOR memory array. NAND and NOR memory configurations described have been presented as examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor material, such as silicon.

The memory elements may be arranged in the single memory device level in an ordered array, such as in a plurality of rows and/or columns. However, the memory elements may be arranged in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements arranged on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material, such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. To illustrate, each of the memory device levels may have a corresponding substrate thinned or removed before stacking the memory device levels to form memory arrays. Because each of the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

In some implementations, the memory 104 is a non-volatile memory having a three-dimensional (3D) memory configuration that is monolithically formed in one or more physical levels of arrays of memory cells having an active area disposed above a silicon substrate. The active area of a memory cell may be an area of the memory cell that is conductively throttled by a charge trap portion of the memory cell. The data storage device 102 includes circuitry, such as the read circuitry 140 and/or the write circuitry of FIG. 1, as an illustrative, non-limiting example, associated with operation of the memory cells.

Associated circuitry is typically used for operation of the memory elements and for communication with the memory elements. As non-limiting examples, memory devices may have circuitry for controlling and driving memory elements to perform functions such as programming and reading. The associated circuitry may be on the same substrate as the memory elements and/or on a separate substrate. For example, a controller for memory read-write operations may be located on a separate controller chip and/or on the same substrate as the memory elements One of skill in the art will recognize that this disclosure is not limited to the particular structures described but cover all relevant memory structures within the spirit and scope of the disclosure as described herein and as understood by one of skill in the art.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
    forming a non-volatile memory having a three-dimensional (3D) memory configuration, wherein forming the non-volatile memory includes:
        forming a first group of memory cells coupled to a first conductive channel, the first conductive channel substantially perpendicular relative to a surface of a substrate;
        forming a first portion of a connector within a hole through an etch stop layer of the non-volatile memory; and
        forming a second group of memory cells, the second group of memory cells coupled to a second conductive channel, wherein the second conductive channel is electrically coupled via the connector to the first conductive channel and is substantially perpendicular relative to the surface of the substrate, wherein the etch stop layer is positioned between the first group of memory cells and the second group of memory cells, and wherein a second portion of the connector extends along a surface of the etch stop layer that is proximate to the first group of memory cells or the second group of memory cells.

2. The method of claim 1, wherein forming the non-volatile memory further includes:
    planarizing a surface of a first group of physical layers after the first group of memory cells is formed;
    forming the etch stop layer above the first group of physical layers relative to the surface of the substrate, wherein the etch stop layer is formed after forming the first group of memory cells, wherein the etch stop layer is formed on at least a portion of the planarized surface;
    etching the etch stop layer to form the hole; and
    wherein the first portion of the connector is formed within the hole by depositing a conductive material within the hole.

3. The method of claim 2, wherein forming the non-volatile memory further includes:
    forming the first group of physical layers; and
    forming a second group of physical layers after forming the first group of memory cells, wherein the second group of the memory cells is formed above the first group of memory cells relative to the surface of the substrate, and wherein forming the etch stop layer is distinct from forming the first group of physical layers and forming the second group of physical layers.

4. The method of claim 3, wherein the second group of physical layers is formed on the etch stop layer, and wherein the etch stop layer is formed prior to forming the second group of physical layers.

5. The method of claim 1, wherein the first conductive channel is offset from the second conductive channel.

6. The method of claim 1, wherein the second group of the memory cells is formed above the etch stop layer relative to the surface of the substrate, wherein the non-volatile memory having the 3D configuration is monolithically formed in one or more physical levels of arrays of memory cells having an active area disposed above the substrate, the non-volatile memory including circuitry associated with operation of the memory cells, and wherein the substrate comprises a silicon substrate.

7. The method of claim 1, wherein forming the non-volatile memory further includes:
    forming a third group of memory cells coupled to a third conductive channel, the third conducive channel substantially perpendicular relative to the surface of the substrate, wherein a first dielectric structure is positioned between the first group of memory cells and the third group of memory cells; and
    forming a fourth group of memory cells coupled to a fourth conductive channel, the fourth conductive channel substantially perpendicular relative to the surface of the substrate, wherein a second dielectric structure is positioned between the second group of memory cells and the fourth group of memory cells, the first dielectric structure positioned between the second dielectric structure and the substrate, and wherein the etch stop layer is positioned between the first dielectric structure and the second dielectric structure.

8. The method of claim 1, wherein forming the first group of the memory cells includes:
    forming a first group of physical layers;
    etching the first group of physical layers to form a first cavity; and
    forming the first conductive channel in the first cavity.

9. The method of claim 8, wherein forming the second group of the memory cells includes:
    forming a second group of physical layers;
    etching the second group of physical layers to form a second cavity; and
    forming the second conductive channel in the second cavity, wherein forming the second conductive channel is distinct from forming the first conductive channel, and wherein each of the first group of physical layers and the second group of physical layers includes less than twenty-four physical layers.

10. The method of claim 9, wherein a combination of the first group of physical layers and the second group of physical layers includes more than twenty-four physical layers.

11. A data storage device comprising:
- a non-volatile memory having a three-dimensional (3D) memory configuration, wherein the non-volatile memory comprises:
  - a first group of memory cells coupled to a first conductive channel, the first conductive channel substantially perpendicular relative to a surface of a substrate;
  - a second group of memory cells coupled to a second conductive channel, the second conductive channel substantially perpendicular relative to the surface of the substrate;
  - an etch stop layer positioned between the first group of memory cells and the second group of memory cells; and
  - a connector that extends through the etch stop layer, wherein the connector is electrically coupled to the first conductive channel and the second conductive channel, and wherein a portion of the connector extends along a surface of the etch stop layer that is proximate to the first group of memory cells or the second group of memory cells.

12. The data storage device of claim 11, further comprising a controller operatively coupled to the non-volatile memory, wherein the controller is configured to read data from or write data to the non-volatile memory, and wherein the non-volatile memory further comprises a bit line, wherein the bit line is coupled to the first conductive channel via the second conductive channel.

13. The data storage device of claim 11, wherein the first conductive channel has a substantially consistent diameter through a first group of physical layers, and wherein the connector is coupled to the first conductive channel and to the second conductive channel.

14. The data storage device of claim 11, wherein each of the first group of the memory cells and the second group of the memory cells includes eighteen to twenty memory cells.

15. The data storage device of claim 11, wherein a first axis of the first conductive channel is substantially perpendicular relative to the surface of the substrate, wherein a second axis of the second conductive channel is substantially perpendicular relative to the surface of the substrate, wherein the first axis is substantially parallel to the second axis, and wherein the first axis is offset from the second axis such that the first conducive channel is not directly below the second conductive channel.

16. The data storage device of claim 11, wherein the first group of memory cells is associated with a first set of wordlines, wherein the second group of memory cells is associated with a second set of wordlines that is different than the first set of wordlines, and wherein the first group of memory cells is positioned between the substrate and the second group of memory cells.

17. The data storage device of claim 11, wherein the non-volatile memory further comprises a third group of memory cells coupled to a third conductive channel, wherein the third conductive channel is electrically coupled to the first conductive channel and to the second conductive channel, wherein the third conductive channel is substantially perpendicular relative to the surface of the substrate, wherein the second conductive channel is electrically coupled to the third conductive channel via a second connector that extends through a second etch stop layer positioned between the second group of the memory cells and the third group of the memory cells, and wherein the second conductive channel has a substantially cylindrical shape between the connector and the second connector.

18. A data storage device comprising:
- a non-volatile memory having a three-dimensional (3D) memory configuration, wherein the non-volatile memory comprises:
  - a first group of memory cells coupled to a first conductive channel, the first conductive channel substantially perpendicular relative to a surface of a substrate;
  - a second group of memory cells coupled to a second conductive channel, the second conductive channel substantially perpendicular relative to the surface of the substrate;
  - a first dielectric structure positioned between the first group of memory cells and the second group of memory cells;
  - a third group of memory cells coupled to a third conductive channel, wherein the third conductive channel is electrically coupled to the first conductive channel, the third conductive channel substantially perpendicular relative to the surface of the substrate;
  - a fourth group of memory cells coupled to a fourth conductive channel, wherein the fourth conductive channel is electrically coupled to the second conductive channel, the fourth conductive channel substantially perpendicular relative to the surface of the substrate;
  - a second dielectric structure positioned between the third group of memory cells and the fourth group of memory cells; and
  - an etch stop layer positioned between the first group of memory cells and the second group of memory cells and positioned between the first dielectric structure and the second dielectric structure.

19. The data storage device of claim 18, further comprising a controller operatively coupled to the non-volatile memory, wherein the controller is configured to read data from or write data to the non-volatile memory.

20. The data storage device of claim 19, wherein the non-volatile memory further comprises a group of physical layers, wherein the first group of memory cells is formed in the group of physical layers, and wherein the first conductive channel has a substantially consistent diameter through the group of physical layers.

* * * * *